United States Patent
An et al.

(10) Patent No.: US 6,789,423 B2
(45) Date of Patent: Sep. 14, 2004

(54) MICRO INERTIA SENSOR AND METHOD OF MANUFACTURING THE SAME

(75) Inventors: Seung Do An, Suwon-Shi (KR); Kyoung Soo Kim, Suwon-Shi (KR); Ji Man Cho, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/330,710

(22) Filed: Dec. 27, 2002

(65) Prior Publication Data

US 2003/0183009 A1 Oct. 2, 2003

(30) Foreign Application Priority Data

Mar. 27, 2002 (KR) ........................................ 2002-16603

(51) Int. Cl.[7] ............................................. G01C 19/00
(52) U.S. Cl. .................................. 73/504.04; 73/504.12
(58) Field of Search ........................ 73/504.14, 504.12, 73/504.02, 504.04, 514.32, 514.16, 514.29

(56) References Cited

U.S. PATENT DOCUMENTS

| | | | | |
|---|---|---|---|---|
| 5,284,057 A | * | 2/1994 | Staller et al. ............ | 73/514.36 |
| 5,368,880 A | * | 11/1994 | McKee et al. .............. | 427/125 |
| 6,391,673 B1 | * | 5/2002 | Ha et al. ...................... | 438/51 |
| 6,481,286 B1 | * | 11/2002 | Bernstein et al. ........ | 73/514.31 |

* cited by examiner

Primary Examiner—Helen Kwok
(74) Attorney, Agent, or Firm—Darby & Darby

(57) ABSTRACT

The present invention provides a micro inertia sensor and a method of manufacturing the same, the micro inertia sensor includes a lower glass substrate; a lower silicon including a first border, a first fixed point and a side movement sensing structure; an upper silicon including a second border, a second fixed point being connected to a via hole, in which a metal wiring is formed, on an upper side, and an sensing electrode, which correspond to the first border, the first fixed point and the side movement sensing structure; a bonded layer by a eutectic bonding between the upper silicon and the lower silicon; and a upper glass substrate, being positioned on an upper portion of the upper silicon, for providing the via hole on which an electric conduction wiring is formed, thereby aiming at the miniaturization of the product and the simplification of the process.

13 Claims, 6 Drawing Sheets

MICRO INERTIA SENSOR AND METHOD OF MANUFACTURING THE SAME

BACKGROUND OF THE INVENTION

1. Field of the Invention

The present invention relates to a micro inertia sensor and a method thereof, the micro inertia sensor such as a micro gyro comprising a device wafer used as a lower structure, a cap wafer used as an upper structure, and a bonding and wiring structure-thereof. The present invention provides a micro sensor being in a new structure as miniaturized in comparison to the existing structure and enabling to sense the up-and-down movement.

2. Description of the Related Art

In general, in the related art of manufacturing a micro sensor such as a micro gyro, the way of accomplishing a wafer-level packaging is used by anodically bonding a silicon micro structure formed on the silicon or glass wafer to the glass wafer.

However, in such a related method, there is one problem that a bending occurs on the bonded surface due to a different coefficient of thermal expansion between the silicon. There is also the other problem such as degassing phenomenon that oxygen generates from the glass when anodic bonding is applied.

Therefore, in order to solve the above-mentioned problems, eutectic bonding between silicon (Si) and gold (Au) is used instead of anodic bonding between glass and silicon. In case of applying the eutectic bonding, there is no stress between the bonded surfaces, thereby improving yield; and there occurs no degassing, thereby enabling to maintain a high vacuum. As a consequence, it has the merit of improving the features of the inertia sensor such as gyro.

In the related art of carrying out the eutectic bonding, a device wafer is manufactured by forming an insulation layer on a first silicon; forming a second silicon on the insulation layer; and patterning, etching and forming a structure body to sense the movement at a border, fixed points and sides.

To prevent any pollution in the process on the device wafer and to keep a sealed state, a cap wafer is manufacture by forming a first insulation layer on a third silicon; forming an electric conduction wiring on the first insulation layer; forming a second insulation layer on the electric conduction wiring; and evaporating Cr/Au layer. A micro inertia sensor is manufactured by bonding the device wafer to the cap wafer by means of the eutectic bonding.

An embodiment according to the related art will be described in detail, on the basis of the attached drawings.

FIGS. 1a–1f are outlined schematic diagrams to illustrate a hermetic packaging process of a micro sensor by forming a device wafer and a cap wafer according to the related art. FIG. 2 is a front cross-sectional structure view illustrating a bonding state of the device wafer to the cap wafer in the hermetic package, wherein a groove portion is formed in the sealing bonded portion of the micro sensor according to the related art.

Figure 1:
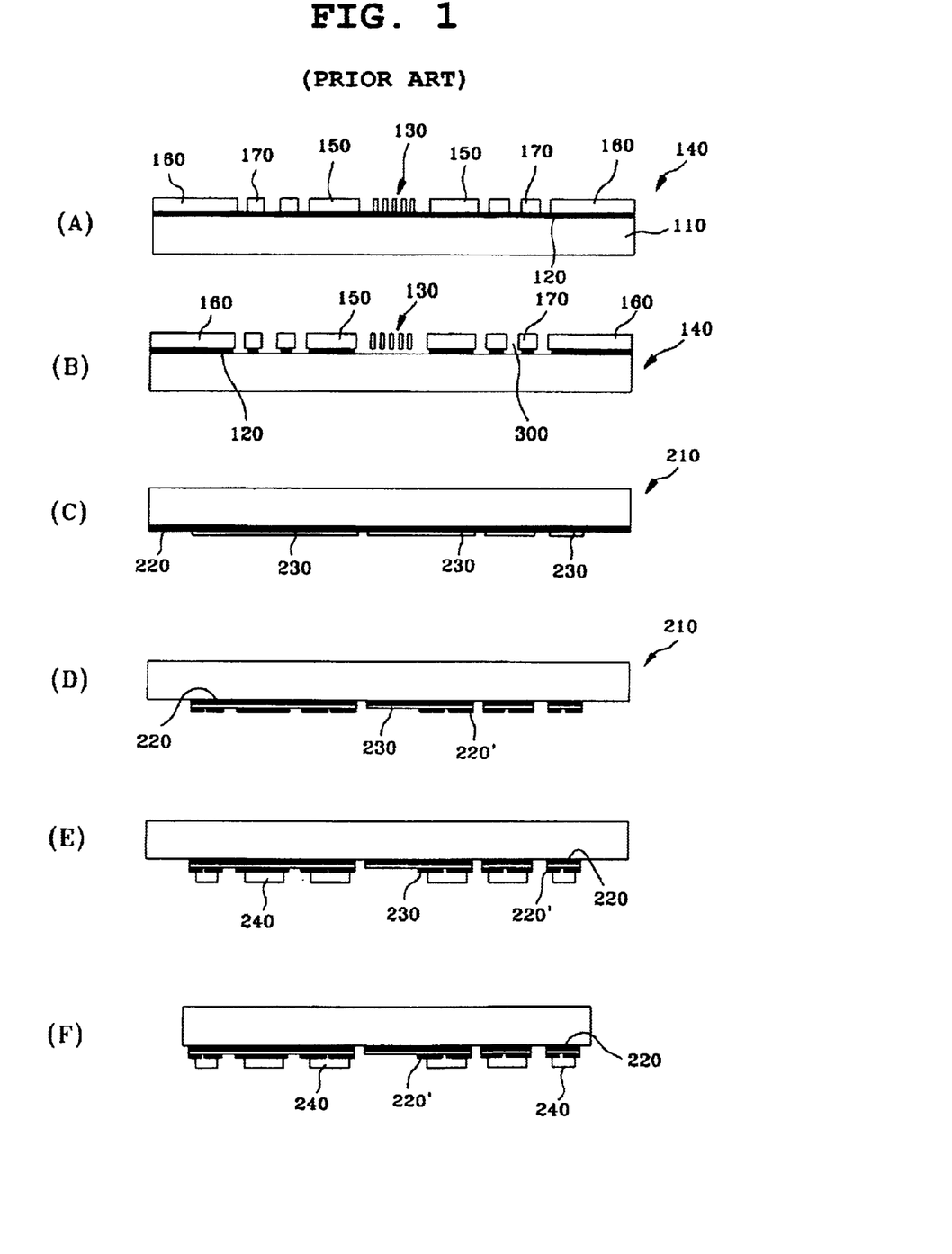
FIGS. 1a–1f are outlined schematic diagrams illustrating a hermetic packaging process of a micro sensor comprising a device wafer and a cap wafer of to a related art.
Figure 2:
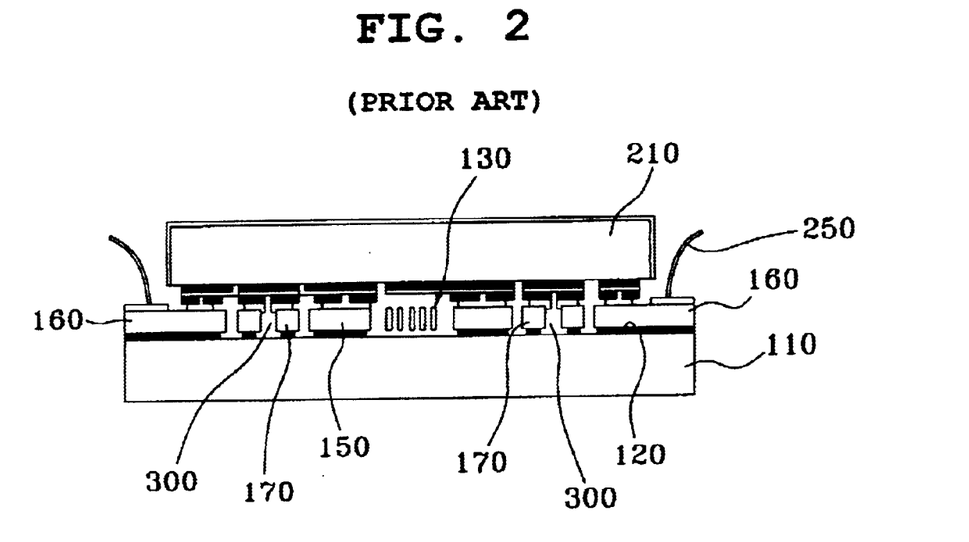
FIG. 2 is a front cross-sectional structure view illustrating a bonding state of the device wafer to the cap wafer, in which the package is completed by forming a groove on a sealing bonding portion of the micro sensor of a related art.

FIG. 1a illustrates a sensor's surroundings of a silicon device wafer 140 including a silicon 110 being about 500 μm in thickness, an insulator 120 of an oxidation film being interposed on the upper portion of the silicon 110, a micro sensor 130 being provided on the upper portion, and an internal fixed point 150 and an external fixed point 160 being formed at regular intervals. Here, a sealing bonding portion 170 having a low melting point, which is sealed by the micro sensor when bonding to a cap wafer 210, is formed between the internal fixed point 150 and the external fixed points 160. A groove 300 forms by etching and removing the lower side of the sealing bonding portion 170.

The device wafer 140 is manufactured and accomplished by removing the insulator 120 excluding the internal fixed point 150, the external fixed point 160 and the sealing bonding portion 170 of a low melting point by means of the etching process as illustrated in FIG. 1b.

A cap wafer 210 of silicon being in regular thickness, which is to bond to the device wafer 140 is provide and insulator 220 and an electric conduction film 230. The insulator 220 is evaporated on the upper portion of the cap wafer 210. The electric conduction film pattern 230 to be bonded to the internal fixed point 150 and the external fixed point 160 of the device wafer 140 is formed on the upper portion of the insulator 220. FIG. 1c shows the conductive film pattern.

A second insulator 220' is evaporated on the upper portion of the electric conduction film pattern 230 to protect the conductive film; and Cr/Au is evaporated on the upper portion of the electric conduction film pattern 230 for patterning (as shown in FIG. 1d).

In FIG. 1f, a wire bonding is provided by etching the outside of the portion of the cap wafer 210 to be connected with the external fixed point 160 of the device wafer 140, wherein the etching is performed by photo-resist not to effect on Cr/Au.

After the device wafer 140 and the cap wafer 210 are manufactured as above, as shown in FIG. 2, heat of 400° C. and pressure are applied to the device wafer 140 and the cap wafer 210. Then, due to the low melting point bonding, Au melts and seals the micro sensor 130 of the device wafer 140. Having conductivity, Au performs two roles of bonding and electric conduction at a time.

Au—Si alloy as melted by heat and pressure by the low melting point bonding is gathered on the corner of the groove 300 formed on the sealing bonding portion 170 when the device wafer 140 is bonded to the cap wafer 210, thereby improving the sealing of the micro inertia sensor 130 positioned on the device wafer 140.

However, the related art as described above has the problems that it is difficult to miniaturize the micro sensor and it is complicate to manufacture and fix it. That is, when power is supplied to the external fixed point 160 as the silicon (Si) layer, the power is connected to the internal fixed point 150 through the wiring between the insulation layers 220 and 220'. Hereby, the change of the side movement is sensed according to the variation of the capacitance. In this regard, the external fixed point 160 must necessarily exist for the power supply from the outside, and the space for the external fixed point 160 must be necessary secured.

There is the trial to form electrodes by removing the external fixed point and forming a via hole on the cap wafer. However, such a trial has a risk to touch the wiring which passes between the insulation layers since the via hole should be most deeply formed to prevent the effects of occurrence such as undercut. In this connection, as the via hole cannot be properly made on the place as desired, there still exits the problem that it is difficult to reduce the size.

SUMMARY OF THE INVENTION

It is, therefore, an object of the present invention to provide a micro inertia sensor forming a device wafer on the lower portion and a cap wafer (SOG: silicon on glass) on the upper portion as the MEMS structure body; and a via hole in the direction from the upper surface of the cap wafer to the device wafer, thereby providing a micro inertia sensor miniaturized and manufactured in a simplified manner.

To achieve the above object, there is provided a micro inertia sensor includes a lower glass substrate; a lower silicon including a first border, a first fixed point and a side movement sensing structure; an upper silicon including a second border, a second fixed point being connected to a via hole, in which a metal wiring is formed, on an upper side, and an sensing electrode, which correspond to the first border, the first fixed point and the side movement sensing structure; a bonded layer by a eutectic bonding between the upper silicon and the lower silicon; and a upper glass substrate, being positioned on an upper portion of the upper silicon, for providing the via hole on which an electric conduction wiring is formed.

The side movement sensing structure comprises a structure being movable in a horizontal direction and a sensing electrode senses a variation of a capacity as the structure horizontally moves, while the sensing electrode senses a capacity in a vertical direction.

Therefore, the inertia sensor can be made of enabling to horizontally and vertically sense on the space of axes x, y and z.

The bonded layer by eutectic bonding in the preferred embodiment of the present invention is characterized by forming by Au—Si eutectic bonding.

That is, the micro inertia sensor comprises the device wafer and the cap wafer with the SOG (silicon on glass) wafer; the via hole formed from the cap wafer; and the sensing electrode senses the upper portion formed on the cap wafer, thereby solving the difficulty in the existing electrode wiring and enabling to miniaturize and to sense the vertical capacity. Specifically, the related art has one problem that the electrode wiring is touched when the via hole is formed and the other problem that a point of contact is not generated due to the effects of undercut. However, those problems are solved in the present invention. In addition, when the via hole is formed from the glass substrate on the SOG wafer to the silicon, the via hole is formed to the silicon layer, and therefore the operating electric current sufficiently flows, extending to the silicon layer.

In addition, the device waver and the cap wafer are made of the SOI (silicon on insulator) wafer, LPCVD polysilicon or Epi polysilicon.

In another aspect of the present invention, there is provided a method of manufacturing the micro inertia sensor comprising the steps of:

forming a device wafer by forming a lower silicon on a lower glass substrate; etching the lower silicon for forming a side movement sensing structure including a structure being movable in a horizontal direction on the lower silicon and an sensing electrode for sensing a variation of a capacity as the structure horizontally moves, a first fixed point, and a first border for bonding; etching the lower glass substrate as a sacrificial layer; and separately evaporating Au for bonding on the lower silicon layer;

forming a cap wafer by forming an upper silicon on an upper glass substrate; forming a gap in the upper silicon; forming an second fixed point, an second border and a second sensing electrode, which correspond to the first fixed point, the first border and the structure movable in a horizontal direction in the device wafer process; and forming the via hole from an upper glass substrate to the second fixed point; and bonding the device wafer and the cap wafer by a eutectic bonding; evaporating an electric conduction layer on the via hole to form an electric conduction wiring.

According to the present invention, Au for eutectic bonding can be formed by a pre-pattern before the structure is formed.

According to the present invention, the metal wiring formation can be pre-progressed before bonding but after forming the via hole.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will now be described with reference to the accompanying drawings. In the following description, same drawing reference numerals are used for the same elements even in different drawings. The matters defined in the description such as a detailed construction and elements of a circuit are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

The constitution of the micro inertia sensor and the method of manufacturing the same according to the present invention will be described in detail, in reference to the drawings.

Figure 3:
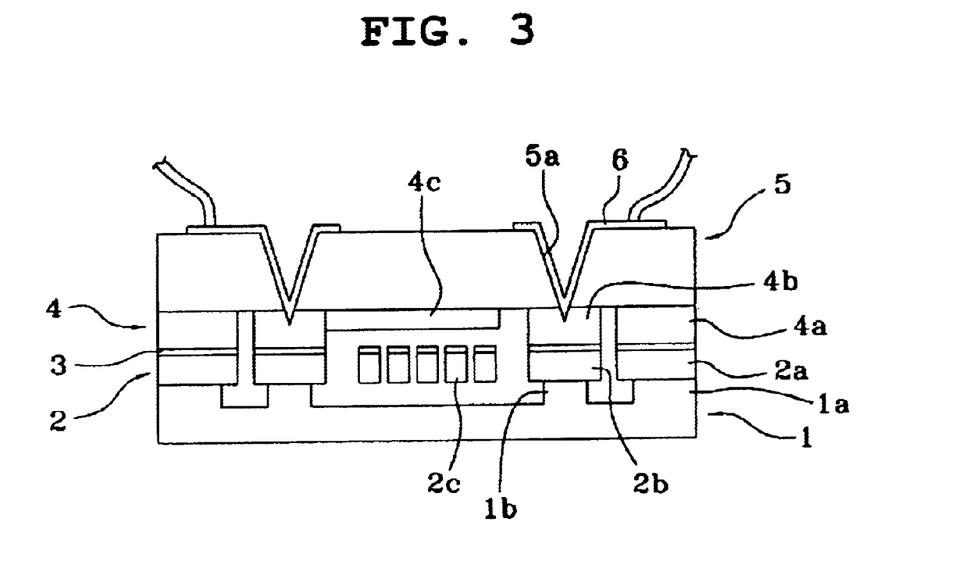
FIG. 3 is a cross-sectional view illustrating a micro inertia sensor according to the present invention.

As illustrated in FIG. 3, a micro inertia sensor of the present invention comprises a lower glass substrate 1 being etched as a sacrificial layer; a lower silicon 2 formed on the lower glass substrate; a upper silicon by eutectic bonding, leaving a space between a bonded layer 3 and the lower silicon 2; and a glass substrate 5 being formed on the upper silicon 4.

Each of the constitution will be described in detail as follows:

The lower glass substrate 1 includes a border 1a, a fixed point 1b, and a middle portion being a space where the sacrificial layer is etched.

The lower silicon 2 formed in the lower glass substrate includes a border 2a, a fixed point 2b and a side movement sensing structure 2c. The border 2a, fixed point 2b and structure 2c are formed to respectively correspond to the border 1a, fixed point 1b and the middle space portion where the sacrificial layer is etched on the lower glass substrate 1.

The border 4a, the fixed point 4b of the upper silicon 4 are formed to correspond to the border 2a, the fixed point 2b and the structure 2c of the lower silicon 2, respectively. The via hole where the metal wiring 6 is formed is connected to the upper side of the fixed point 4b.

Figure 4:
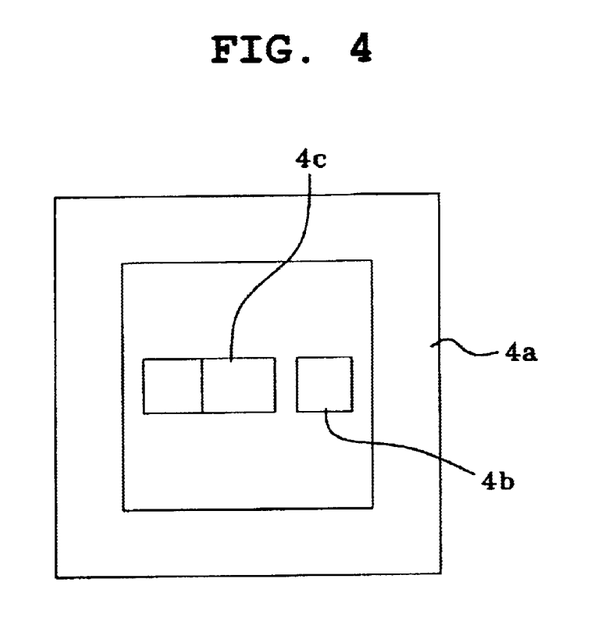
FIG. 4 is a plane view illustrating a upper silicon as a constitutional element of a cap wafer of the micro inertia sensor according to the present invention.

The structure 2c of the lower silicon includes the sensing electrode for sensing the capacity change in a vertical direction, which is provided by forming separate layers. FIG. 4 illustrates the location 4c of the corresponding upper electrode.

Figure 5:
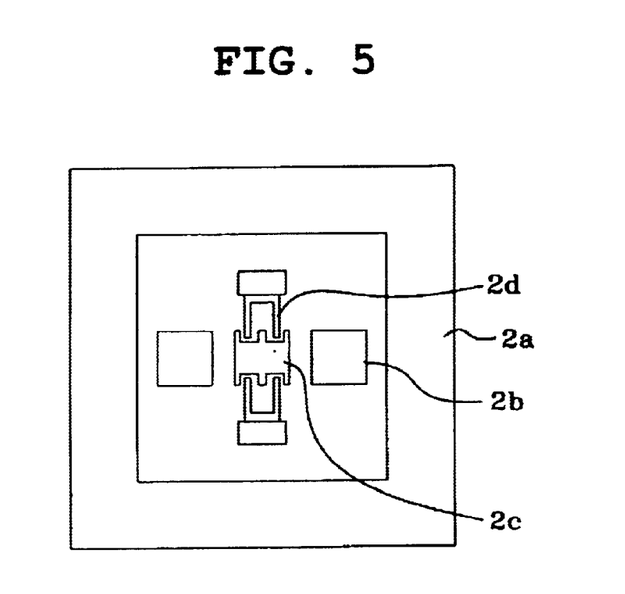
FIG. 5 is a plane view illustrating a lower silicon as a constitutional element of a device wafer of the micro inertia sensor according to the present invention.

The sensing electrode 2d senses the capacity in a horizontal direction of the structure 2c of the lower silicon is formed on the same surface as the structure 2c of the lower silicon as shown in FIG. 5.

The top portion includes the upper glass substrate 5 as shown in FIG. 3; and the V-shaped via hole 5a at the both sides around the position corresponding to the upper fixed point 4a of the upper silicon is formed to the inside of the upper fixed point. On the upper side of the via hole 5a, the metal wiring 5 is formed.

Figure 6:
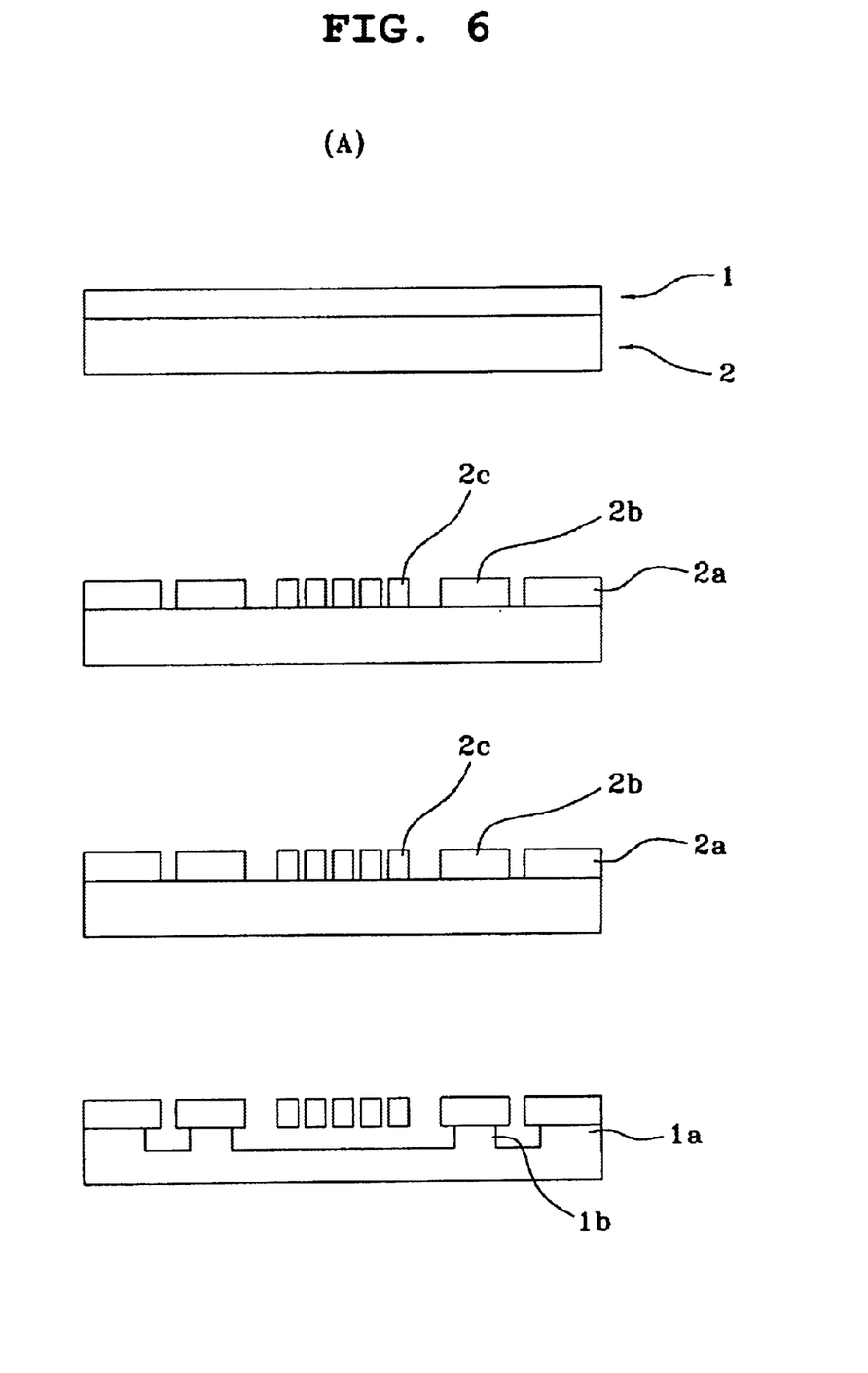
FIG. 6 is a flow chart illustrating a process of manufacturing the micro inertia sensor according to the present invention.

Hereinafter, a method of manufacturing the micro inertia sensor will be described in detail:

FIG. 6 illustrates a process and a method of manufacturing the micro inertia sensor according to the present invention.

As illustrated in FIGS. 6(A)–6(C), the lower silicon 2 is formed on the lower glass substrate 1. The lower silicon 2 is etched so that the border 2a around of the lower silicon 2 is formed for sealing and bonding, and simultaneously the fixed point 2b and the structure 2c are formed, the structure 2c using RIE to move horizontally.

The lower glass substrate 1 is etched as the sacrificial layer by means of the HF solution, thereby making the structure 2c being in a release state to rise in an air. Therefore, the lower silicon 2 is divided as the border 2a, the fixed point 2b and the structure 2c, and at the upper side, an additional bonding Cr/Au is evaporated to form the bonded layer 3. Usually this step is done after the sacrificial layer is etched, however, it is possible to be done by a pattern before the sacrificial layer is etched.

The device wafer forms by the above-described steps.

Different from a process of forming the device wafer, a process of forming the cap wafer comprises the steps of forming the upper silicon 4 on the upper glass substrate 5; forming a gap in the upper silicon 4 to sense the up-and-down movement of the device wafer structure 2c; and RF etching and separating the upper silicon 4 with the gap so that the border 4a, the fixed point 4b are formed on the locations corresponding to the border 2a, the fixed point 2b and the structure 2c of the device wafer; and enabling the upper electrode layer 4c to sense the capacity in a vertical direction by the relative movement of the structure 2c in a vertical direction.

In addition, the method of manufacturing the micro inertia sensor according to the present invention also comprises a process of forming the V-shaped via hole 5a under the upper glass substrate 4 side on the pad corresponding to the fixed point 4b.

Through a series of the processes, the micro inertia sensor according to the present invention is manufactured by bonding the device wafer to the cap wafer by means of eutectic bonding, and forming the metal wiring 6 on the via hole.

According to the above processes, after manufacturing the structure body, the case packing is performed by wire bonding in case that SOG (silicon on glass) MEMS structure body is formed and applied as an inertia sensor, there were several problems in the related art. That is, the pollution occurred on dicing and die-bonding for the sensor's die, and it is difficult to apply, at a low price, the hermetic packaging to the inertia sensor sensitive to the environmental atmosphere in case packaging process. Accordingly, as a way to replace the case packaging, the wafer-level hermetic packaging is used, thereby removing the pollution occurred when dicing and die-bonding, and enabling to seal the sensor not to be sensitive to the environmental atmosphere. To improve the capacity of the inertia sensor and the RF element, the hermetic packaging is realized in the vacuum environment, thereby enabling to manufacture the highly efficient element at the lower price.

Furthermore, it has the merits that any wiring to form the electrode is unnecessary and a certain miniaturization is possible.

In the present application, the wafer-level hermetic packaging is realized by forming the structure on the device wafer of the SOG MEMS structure body and by bonding the SOG cap wafer on which the hole for the sensing electrode and wiring is formed. Accordingly, after-processing that is, the present invention provides the effects of reducing the drop of the yield resulted from the dicing and the case packing, simplifying the process and miniaturizing.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A micro inertia sensor comprising
    a lower glass substrate;
    a lower silicon including a first border, a first fixed point and a side movement sensing structure;
    an upper silicon including a second border, a second fixed point being connected to a via hole, in which a metal wiring is formed, on an upper side, and a sensing electrode, which correspond to the first border, the first fixed point and the side movement sensing structure;
    a bonded layer by an eutectic bonding between the upper silicon and the lower silicon; and
    an upper glass substrate, being positioned on an upper portion of the upper silicon, for providing the via hole on which an electric conduction wiring is formed.

2. The micro inertia sensor according to claim 1, wherein the side movement sensing structure comprises a structure being movable in a horizontal direction and a sensing electrode for sensing a variation of a capacity as the structure horizontally moves.

3. The micro inertia sensor according to claim 1, wherein the sensing electrode senses the capacity in a vertical direction.

4. The micro inertia sensor according to claim 1, wherein the bonded layer by the eutectic bonding is formed by Au—Si eutectic bonding.

5. The micro inertia sensor according to claim 1, wherein the via hole is formed on the upper glass substrate, extending to the inside of the second fixed point of the upper silicon.

6. A micro inertia sensor comprising:

a lower substrate;

a device wafer comprising a lower silicon including a structure on which a first border, a first fixed point and a first sensing electrode for sensing a capacity in a horizontal direction are formed on the same surface of the lower substrate;

an upper silicon including a second border, a second fixed point and a second sensing electrode for sensing a capacity in a vertical direction between the structure, which correspond to the first border, the first fixed point and the structure on the lower silicon, respectively;

a cap wafer, being positioned on an upper portion of the upper silicon, and including an upper substrate providing a via hole connected to a metal wiring; and a bonded layer by an eutectic bonding between the upper silicon and the lower silicon.

7. The micro inertia sensor according to claim 6, wherein the via hole is formed on the upper substrate, extending to the inside of the second fixed point of the upper silicon.

8. The micro inertia sensor according to claim 6, wherein the lower substrate and the upper substrate are made of glass.

9. The micro inertia sensor according to claim 6, wherein the via hole is formed in a "V" shape from the upper substrate to the inside of the upper silicon, by evaporating a metal film of an electric conductivity.

10. The micro inertia sensor according to claim 6, wherein the device wafer and the cap wafer are SOG (silicon on glass) wafer.

11. The micro inertia sensor according to claim 6, wherein the device wafer and the cap wafer are SOI (silicon on insulator) wafer.

12. The micro inertia sensor according to claim 6, wherein the device wafer and the cap wafer are LPCVD polysilicon wafer.

13. The micro inertia sensor according to claim 6, wherein the device wafer and the cap wafer are Epi polysilicon wafer.

* * * * *